US012687843B2

(12) United States Patent
Munk et al.

(10) Patent No.: US 12,687,843 B2
(45) Date of Patent: Jul. 21, 2026

(54) DEVICE FOR TESTING AN ELECTRONIC CONTROL UNIT, COMPRISING A HARDWARE-IN-THE-LOOP SIMULATOR

(71) Applicant: dSPACE GmbH, Paderborn (DE)

(72) Inventors: Cedrik Munk, Paderborn (DE); Christian Dierkes, Paderborn (DE); Andre Kethler, Paderborn (DE)

(73) Assignee: dSPACE GmbH, Paderborn (DE)

( * ) Notice: Subject to any disclaimer, the term of this patent is extended or adjusted under 35 U.S.C. 154(b) by 407 days.

(21) Appl. No.: 18/535,538

(22) Filed: Dec. 11, 2023

(65) Prior Publication Data

US 2024/0103508 A1 Mar. 28, 2024

Related U.S. Application Data

(63) Continuation of application No. PCT/EP2021/084105, filed on Dec. 3, 2021.

(30) Foreign Application Priority Data

Jun. 11, 2021 (DE) ..................... 10 2021 115 141.4

(51) Int. Cl.
*G05B 23/02* (2006.01)
*G06F 30/20* (2020.01)

(52) U.S. Cl.
CPC ......... *G05B 23/0256* (2013.01); *G06F 30/20* (2020.01)

(58) Field of Classification Search
CPC .... G05B 23/0256; G05B 9/02; G05B 19/042; G05B 2219/23446; G05B 2219/23449; G05B 17/02; G06F 30/20; G06F 11/261
See application file for complete search history.

(56) References Cited

U.S. PATENT DOCUMENTS 5,214,582 A 5/1993 Gray
8,724,267 B2 5/2014 Gruber
(Continued)

FOREIGN PATENT DOCUMENTS

DE 102010033433 A1 2/2012
DE 102010043661 A1 5/2012
(Continued)

OTHER PUBLICATIONS

International Search Report dated Feb. 23, 2022 in corresponding application PCT/EP2021/084105.

*Primary Examiner* — Keith D Bloomquist
(74) *Attorney, Agent, or Firm* — Muncy, Geissler, Olds & Lowe, P.C.

(57) ABSTRACT

A device for testing an electronic control unit with a hardware-in-the-loop simulator to simulate at least one sensor signal and equipped with a two-wire cable via which the sensor signal is outputted, and with a switchover device which is connected to the hardware-in-the-loop simulator via the two-wire cable, so that the sensor signal is receivable from the switchover device. The two-wire cable in the switchover device is routed to a two-pole interface of the switchover device to which the electronic control unit can be connected in order to receive the sensor signal, and the switchover device has two voltage sources, each of which is assigned to a wire of the two-wire cable and can be connected to the respective wire via a controllable switch. In this way, it is possible to continue to supply the sensor with electrical energy via two switchable voltage sources during diagnostics, thus avoiding diagnostic errors.

10 Claims, 3 Drawing Sheets

(56)         References Cited

U.S. PATENT DOCUMENTS

2004/0205700 A1 *  10/2004  Leu ........................... G06F 9/44
                                                717/106
2012/0119765 A1 *   5/2012  Bracker ................. G01R 31/36
                                                324/750.01
2013/0204141 A1 *   8/2013  Barrett ................. A61B 5/0059
                                                600/476
2019/0213290 A1 *   7/2019  Delva ..................... G06F 30/15

FOREIGN PATENT DOCUMENTS

DE        102015108064 A1    11/2016
WO          WO9214216 A1     8/1992

* cited by examiner

DEVICE FOR TESTING AN ELECTRONIC CONTROL UNIT, COMPRISING A HARDWARE-IN-THE-LOOP SIMULATOR

This nonprovisional application is a continuation of International Application No. PCT/EP2021/084105, which was filed on Dec. 3, 2021, and which claims priority to German Patent Application No. 10 2021 115 141.4, which was filed in Germany on Jun. 11, 2021, and which are both herein incorporated by reference.

BACKGROUND OF THE INVENTION

Field of the Invention

The present invention relates to a device for testing an electronic control unit with a hardware-in-the-loop simulator designed to simulate at least one sensor signal and equipped with a two-wire cable over which the sensor signal can be output, and with a switchover device connected to the hardware-in-the-loop simulator via the two-wire cable so that the sensor signal can be received from the switchover device.

Description of the Background Art

Complex electronic systems for controlling mechanics are used in a variety of different applications. As a rule, these electronic control systems are designed in such a way that an electronic signal can be measured and transmitted via a sensor and, as a function of this sensor signal, a mechanism can be activated. A widely used application is, for example, electronic control systems in a motor vehicle. Modern vehicles have a large number of sensors, such as a headlight range sensor, a transmission sensor, a tire pressure sensor, a wheel speed sensor, a rain sensor, etc. Depending on the measured sensor data, mechanics or systems can be controlled in the vehicle. For example, depending on the sensor data from the headlight range sensor, the width of the light cone can be adjusted, or an electronic braking system (EBS) can be controlled based on the sensor data from a wheel speed sensor.

In the development of these vehicles, it is essential to test the functionality and reliability of the respective controllers in conjunction with a sensor. Since field tests are often time-consuming, costly and involve a great deal of effort, a simulation of the sensor and the sensor data is usually used. By simulating a sensor or the sensor data, an electronic control system can be tested efficiently without the need for field tests.

Electronic control units usually have an evaluation unit and a diagnostics unit. The evaluation unit receives and processes the sensor data, while the diagnostics unit detects any faults in the connection between the electronic control unit and the sensor.

Conventional devices for testing an electronic control unit have a simulator that simulates a sensor or the associated sensor data. An electronic control unit to be tested is connected to this simulator. The electronic control unit is designed in such a way that in a normal state, in which the sensor data is evaluated, the evaluation unit of the electronic control unit is connected to the simulator and the diagnostic device of the electronic control unit is disconnected from the simulator. In a diagnostic state in which the connection between the electronic control unit and the sensor is examined, the evaluation unit is disconnected and the diagnostic device is connected.

Depending on the type of simulated sensor, the supply of the sensor with electrical energy can take place via the same interface as the signal transmission. The simulated sensor is then connected, for example, to the evaluation unit of the electronic control unit via a two-wire power interface, which ensures both the transmission of the signal and the supply of electrical energy to the sensor.

The problem with such sensors is that in the diagnostic state in which the evaluation unit is disconnected, the supply of electrical energy to the sensor is also interrupted. In particular, this can lead to diagnostic errors in the electronic control unit, so that ECU diagnostics do not detect a hardware defect or error memory entries. In order not to generate diagnostic errors or error memory entries, the simulated power interface must be completely galvanically isolated.

The devices known from the conventional art do not allow for providing a device for testing an electronic control unit in which the sensor is not galvanically isolated during diagnostics.

SUMMARY OF THE INVENTION

It is therefore an object of the invention is to provide a device for testing an electronic control unit that enables a reliable simulation of a sensor signal.

According to an example of the invention, a device for testing an electronic control unit is thus provided, with a hardware-in-the-loop simulator (HIL simulator), which is configured to simulate at least one sensor signal and is equipped with a two-wire cable over which the sensor signal can be output, and with a switchover device connected to the hardware-in-the-loop simulator via the two-wire cable so that the sensor signal can be received from the switchover device, wherein the two-wire cable in the switchover device is routed to a two-pole interface of the switchover device, to which the electronic control unit can be connected in order to receive the sensor signal, and the switchover device has two voltage sources, each of which is assigned to a wire of the two-wire cable and can be connected to this respective wire by means of a controllable switch.

It is therefore a decisive point of the invention that it is possible to connect non-galvanically isolated power sensor interfaces to electronic control units via a simple passive circuit and to be able to carry out the diagnostics of the electronic control units reliably and without errors.

Due to the switchover device, the simulated sensor can continue to be supplied with electrical energy via two switchable voltage sources in the diagnostic state in which the evaluation unit is disconnected. As a result, diagnostic errors can be avoided. The switchover device has two main tasks. Firstly, the disconnection of the power sensor simulation when sensor diagnostics is activated by the electronic braking system and secondly, the generation of a freewheel path for the simulated power sensor signal to reduce compensatory processes and enable fast switching. Due to the fact that the regulated current of the sensor simulation can flow, compensatory processes are avoided by adjusting the power source or sink of the simulated sensor when activating or deactivating the diagnostics.

The switchover device can have a sensing and switching device which is connected to one of the two wires of the two-wire cable in the switchover device and is set up to detect the signal on that wire and which is connected to the controllable switches in such a way that they can be switched with the sensing and switching device depending on the signal detected on the wire. As a result, the sensing and switching device can be used to pick up a signal from a wire and, depending on the tapped signal, connect or disconnect the voltage sources by closing or opening the switches. The tapped signal is, for example, a signal that provides information about the existence of a possible diagnostic state of an electrical control unit. In this way, the presence of a diagnostic state can be detected and the voltage sources used to supply the sensor with electrical energy can be switched on by closing the switches.

The signal to be detected on the wire can be intended to function as an input signal for real-time signal processing on the switchover device. The sensing and switching device can be electrically connected with a simulated brake and/or drive system, in particular with a simulated combustion engine and/or a simulated electric motor drive, wherein the signal processing is intended to have a time-controlling effect on a switching process of the switching device.

As explained above, the sensor can perform different functions. According to a preferred development of the invention, the sensor is a wheel speed sensor, or the simulated sensor is a simulated wheel speed sensor. Wheel speed sensors record the speed of the wheels and transmit this data to an electronic control unit of an anti-lock braking system (ABS) or an electronic stability program (ESP) or to an electronic braking system (EBS).

The sensing and switching device can have a comparator. A comparator can be an electronic circuit that compares two voltages. The output indicates in binary or digital form which of the two input voltages is higher. This makes it effectively a 1-bit analog-to-digital converter. A signal is available at the output of the comparator to indicate which of the two input voltages is higher. If the voltage at the positive, non-inverting input is higher than the voltage at the negative, inverting input, the output voltage approaches the positive supply voltage. If the ratios are reversed, the output voltage goes against the negative supply voltage. The comparator can check whether a diagnostic voltage is present or not.

The switchover device can have a diode in each wire of the two-wire cable, wherein the respective blocking direction of the diodes points once to the hardware-in-the-loop simulator and once away from the hardware-in-the-loop simulator. When the diagnosis is active, the diodes are permanently operated in the blocking direction. At the same time, the voltage sources continue to supply or lower the necessary current to continue to regulate the power source/ sink of the sensor simulation. The blocking directions are selected in such a way that when the switches are opened or the voltage sources are disconnected, the simulated current of the sensor simulation commutates back to the electronic control unit via the diodes. The sensor can thus be simulated via simple non-galvanically isolated power interfaces. The amperage in the power interface is preferably between 0 and 30 mA.

Various switches can be used as switches for connecting and disconnecting the voltage sources. According to a preferred further development of the invention, the controllable switches each can have a relay, a metal-oxide semiconductor field-effect transistor (MOSFET) or a bipolar transistor (BJT). This selection of switches is characterized in that the switches have advantages in terms of production technology and can therefore be produced cost-effectively. In addition, they have a fast switching time, so that dynamic switching is possible and compensatory processes during decoupling of the simulation are avoided.

According to the invention, an arrangement is also provided with a device described above and an electronic control unit to be tested, which is connected to the two-pole interface of the switchover device in order to receive the sensor signal, wherein the electronic control unit has an evaluation unit, a diagnostics unit and a switching device, the evaluation unit is configured to evaluate the sensor signal and to supply a sensor that can be connected to the electronic control unit with electrical energy, the diagnostics unit is set up to generate a diagnostic signal for the sensor that can be connected to the electronic control unit, and the switching device is connected between the two-pole interface on the one hand and the evaluation unit and the diagnostics unit on the other in such a way that, for a normal state, the switching device can be used to connect the evaluation unit to the two-pole interface or, for a diagnostic state, the diagnostics unit can be connected to the two-pole interface.

It is also provided that in the normal state the two voltage sources of the switchover device can be disconnected from the two wires of the two-wire cable and, in the diagnostic state, the two voltage sources of the switchover device can be connected to the two wires of the two-wire cable. Consequently, a distinction is made between two states: the normal state and the diagnostic state. In the normal state, the evaluation unit of the electronic control system is connected to the switchover device and the diagnostics unit is disconnected. The switchover device is connected to the simulator so that the simulated sensor is supplied with electrical energy in the normal state via the evaluation unit. In the diagnostic state, the evaluation unit is disconnected and the diagnostics unit is connected to the switchover device. In the diagnostic state, the simulated sensor is no longer supplied with electrical energy via the evaluation unit. For this purpose, the controllable switches are closed in the diagnostic state so that the two voltage sources are connected to the two-wire cable. Accordingly, the simulated sensor is supplied with electrical energy in the diagnostic state via the voltage sources that are switched on.

It follows that, via the switchable voltage sources, the simulated sensor, which is simulated with the assistance of the HIL simulator, can continue to be supplied with power even if the control unit and thus the actual power supply of the sensor is decoupled in the diagnostic state.

The switchover device can have two diodes arranged in such a way that they are operated in blocking direction in the diagnostic state. As a result, when the switches are opened or the voltage sources disconnected, the simulated current of the sensor simulation commutates back to the electronic control unit via the diodes.

As already explained, the electronic control unit can perform various functions. The electronic control unit can be an electronic braking system (EBS). The EBS can electronically transmit the driver's deceleration commands to all components of the braking system in order to shorten reaction time, compensate for braking forces and enable efficient brake management between service and continuous braking. In an interplay between the wheel speed sensor and the EBS, when the sensor is disconnected, the diagnostic functions are satisfied by an internal diagnostics in the electronic braking system because the wheel speed sensor simulation is decoupled.

The sensor can be grounded (GND). For example, the GND reference in a motor vehicle is the "Terminal 31". In the normal state, the expected potential at one of the sensor's connections is at potential $\phi=0$. The comparator compares the expected voltage and the applied voltage so that conclusions can be drawn as to whether the diagnostic device is active and the power supply from the control unit is interrupted, or whether the diagnostic device is inactive and the power supply from the control unit is not interrupted.

In a first step, the use of the mentioned arrangement includes supplying the sensor with electrical energy via the evaluation unit. The normal state is present. After that, the diagnostics unit is switched on and the evaluation unit is switched off. In this process, a diagnostic signal generated by the diagnostics unit is detected in order to then connect the two voltage sources to the two wires of the two-wire cable. The sensor is supplied with electrical energy via the two voltage sources. The diagnostic state is present. After that, the diagnostics unit is switched off and the evaluation unit is switched on. As a result, a missing diagnostic signal is recorded. The two voltage sources are then disconnected from the two wires of the two-wire cable. The normal state is again present. In a demand-optimized interval, the system switches back and forth between the normal state and the diagnostic state.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
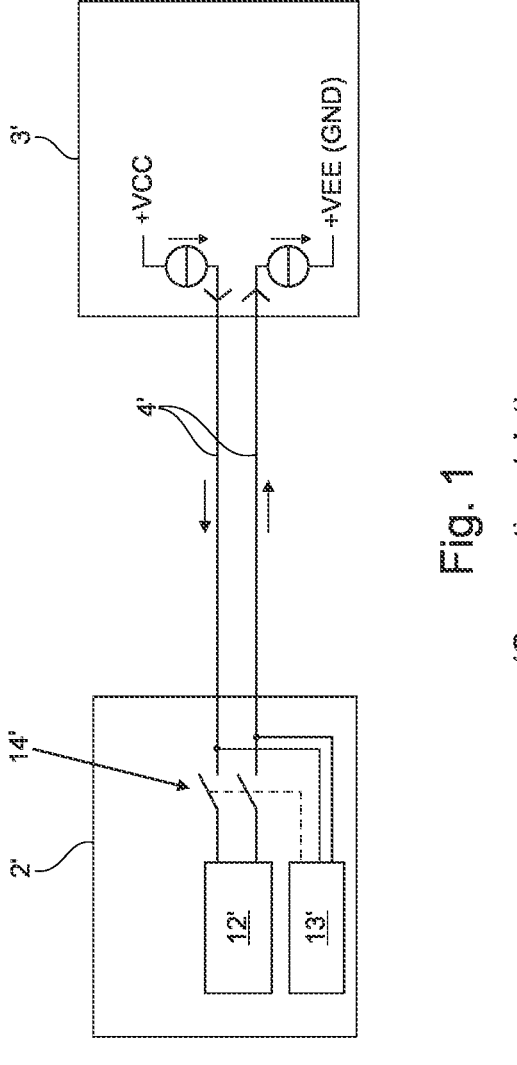
FIG. 1 shows schematically, a device for testing an electronic control unit according to the conventional art.

FIG. 1 schematically shows a device for testing an electronic control unit 2', which is known from the conventional art. The electronic control unit 2' is connected to the simulator 3' via the two-wire cable 4'. The electronic control unit 2' comprises an evaluation unit 12' and a diagnostics unit 13'. The evaluation unit 12' can be connected or disconnected via the switching device 14'. In the normal state, the evaluation unit 12' is connected and the diagnostics unit 13' is disconnected, so that the simulated sensor can be supplied with power via the evaluation unit 12'. In the diagnostic state, the evaluation unit 12' is disconnected and the diagnostics unit 13' connected, so that the simulated sensor can no longer be supplied with power via the evaluation unit 12'. This means that the simulated sensor cannot be supplied with power in the diagnostic state. In order not to generate diagnostic errors or error memory entries, the simulated power interface must be completely galvanically isolated.

Figure 2A:
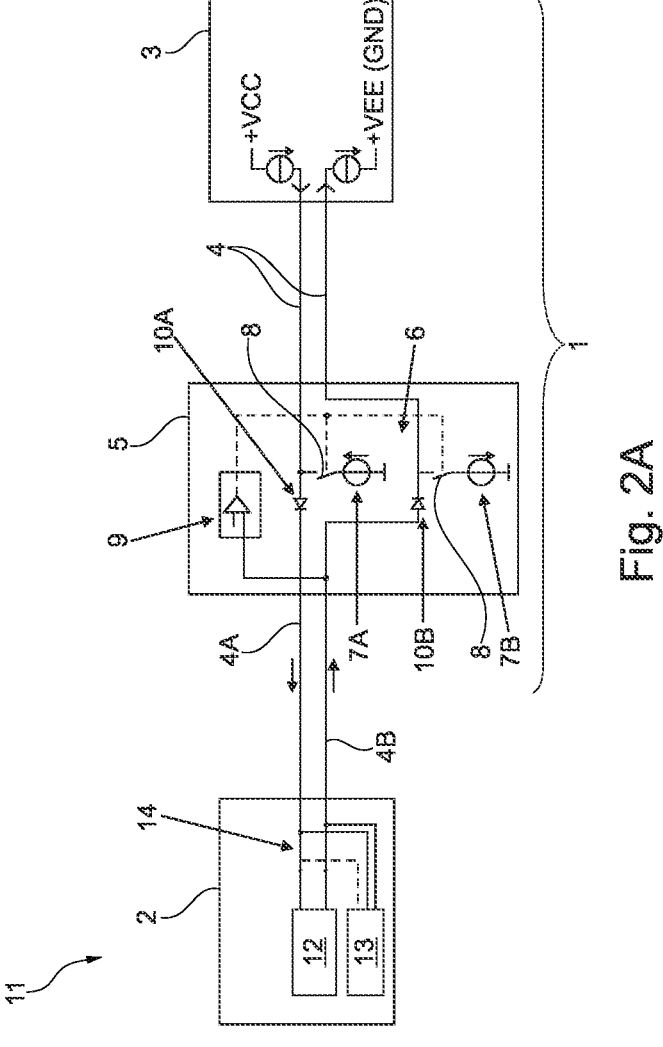
FIG. 2A shows schematically, a device for testing an electronic control unit according to an example of the invention in the normal state.

FIG. 2A schematically shows an arrangement 11 with a device 1 for testing an electronic control unit 2 according to an example of the invention in the normal state. The electronic control unit 2 is connected to the HIL simulator 3 via a two-wire cable 4 via the switchover device 5. In the normal state, the evaluation unit 12 of the electronic control unit 2 is connected to the simulator 3. The simulated sensor is powered by the evaluation unit 12. The switches 8 are open, so the voltage sources 7A, 7B are not connected. When the diagnostics start, the sensing and switching device 9 detects a diagnostic voltage. This is the sign that the diagnostics are starting. The switches 8 are then closed by the sensing and switching device 9.

Figure 2B:
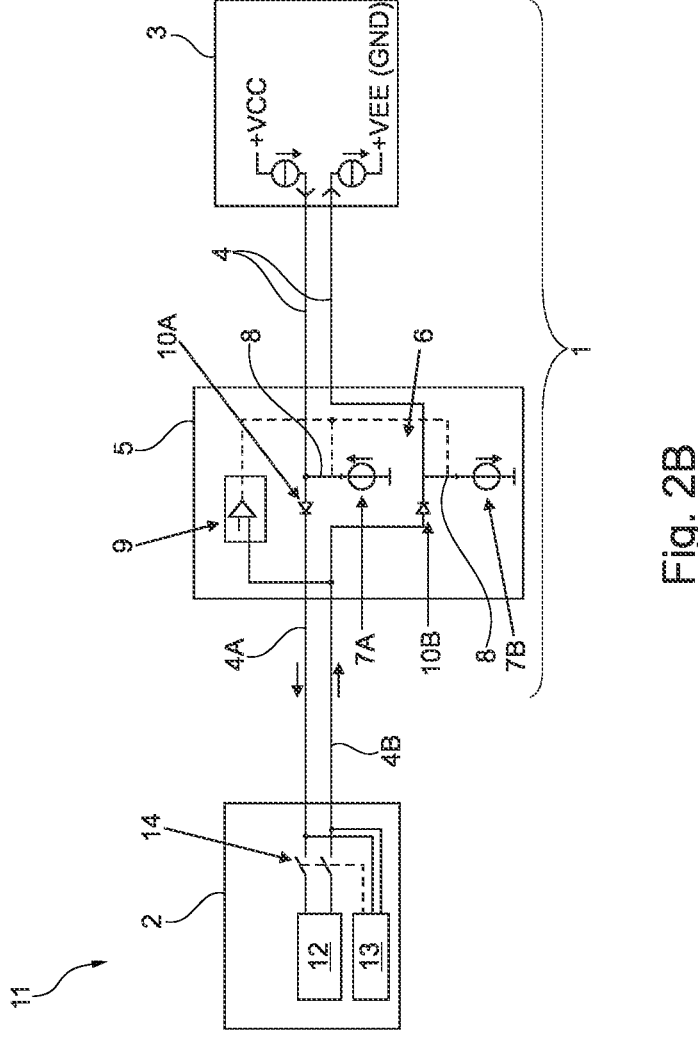
FIG. 2B shows schematically, a device for testing an electronic control unit according to an example of the invention in the diagnostic state.

FIG. 2B shows the diagnostic state that then occurs. The diagnostics unit 13 is active and the evaluation unit has been disconnected from the simulator 3 via the switching device 14. The switches 8 are closed, so that the voltage sources 7A, 7B are connected. A first voltage source 7A is connected with a first wire 4A of the two-wire cable 4 and a second voltage source 7B with a second wire 4B of the two-wire cable 4. The first wire 4A has a first diode 10A and the second wire 4B has a second diode 10B. The diodes 10A, 10B are operated in the blocking direction. The simulated sensor is powered by the voltage sources 7A, 7B. When the diagnostics are finished, the diagnostic signal is not received and the evaluation unit 12 is reconnected. After the sensing and switching device 9 has detected the lack of the diagnostic signal, the sensing and switching device 9 opens the switches 8 so that the voltage sources 7A, 7B are disconnected. The normal state is again present.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A device to test an electronic control unit, the device comprising:
   a hardware-in-the-loop simulator that is configured to simulate at least one sensor signal and comprises a two-wire cable via which the sensor signal is outputtable; and
   a switchover device connected to the hardware-in-the-loop simulator via the two-wire cable so that the switchover device receives the sensor signal, the two-wire cable in the switchover device being routed to a two-pole interface of the switchover device to which the electronic control unit is connectable in order to receive the sensor signal;
   two voltage sources arranged in switchover device, each of the two voltage sources being assigned to a wire of the two-wire cable and being connected to the respective wire via a controllable switch.

2. The device according to claim 1, wherein the switchover device comprises a sensing and switching device that is connected in the switchover device to one of the wires of the two-wire cable and is set up to detect the signal on this wire and is connected to the controllable switches such that they are switched with the sensing and switching device depending on the signal detected on the wire.

3. The device according to claim 1, wherein the sensor is a wheel speed sensor.

4. The device according to claim 1, wherein the sensing and switching device has a comparator.

5. The device according to claim 1, wherein the switchover device has one diode in each wire of the two-wire cable, and wherein the respective blocking direction of the diodes once points to the hardware-in-the-loop simulator and once away from the hardware-in-the-loop simulator.

6. The device according to claim 1, wherein the controllable switches each comprise a relay, a metal-oxide semiconductor field-effect transistor or a bipolar transistor.

7. The arrangement according to claim 1, wherein the switchover device comprises two diodes arranged such that the two diodes are operated in the blocking direction in the diagnostic state.

8. The arrangement according to claim 1, wherein the electric control unit is an electronic braking system.

9. An arrangement comprising:

the device according to claim 1; and an electronic control unit to be tested, the electronic control unit being connectable to the two-pole interface of the switchover device to receive the sensor signal, the electronic control unit comprising an evaluation unit, a diagnostics unit and a switching device, the evaluation unit being configured to evaluate the sensor signal and to supply a sensor that is connectable to the electronic control unit with electrical power, wherein the diagnostics unit is set up to generate a diagnostic signal for the sensor that is connectable to the electronic control unit, and wherein the switching device is connected between the two-pole interface and the evaluation unit and the diagnostics unit such that the switching device is either used to connect the evaluation unit to the two-pole interface for a normal state or connect the diagnostics unit to the two-pole interface for a diagnostic state.

10. The arrangement according to claim 9, wherein, in the normal state, the two voltage sources of the switchover device are disconnected from the two wires of the two-wire cable and, in the diagnostic state, the two voltage sources of the switchover device are connected to the two wires of the two-wire cable.

* * * * *